(12) United States Patent
Jangjian et al.

(10) Patent No.: US 6,979,656 B2
(45) Date of Patent: Dec. 27, 2005

(54) CARBON AND HALOGEN DOPED SILICATE GLASS DIELECTRIC LAYER AND METHOD FOR FABRICATING THE SAME

(75) Inventors: Shiu-Ko Jangjian, Fengshan (TW); Jun Wu, Kuenshan Shiang (TW); Chi-Wen Liu, Hsinchu (TW); Ying-Lung Wang, Lungjing Shiang (TW); Yi-Lung Cheng, Taipei (TW); Michael Chang, Hsinchu (TW); Szu-An Wu, Hsin-Chu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 89 days.

(21) Appl. No.: 10/729,217

(22) Filed: Dec. 4, 2003

(65) Prior Publication Data
US 2005/0121751 A1  Jun. 9, 2005

(51) Int. Cl.⁷ ............................................... H01L 21/31
(52) U.S. Cl. ........................ 438/783; 438/787; 438/789
(58) Field of Search .............................. 438/783, 787, 438/789, 633, 691, 692, 758–765

(56) References Cited

U.S. PATENT DOCUMENTS

| 6,365,528 B1 | 4/2002 | Sukharev et al. |
| 6,511,923 B1 * | 1/2003 | Wang et al. ............... 438/783 |
| 6,518,646 B1 | 2/2003 | Hopper et al. |

* cited by examiner

Primary Examiner—Roy Potter
(74) Attorney, Agent, or Firm—Tung & Associates

(57) ABSTRACT

A method for fabricating a dielectric layer provides for use of a carbon source material separate from a halogen source material when forming a carbon and halogen doped silicate glass dielectric layer. The use of separate carbon and halogen source materials provides enhanced process latitude when forming the carbon and halogen doped silicate glass dielectric layer. Such a carbon and halogen doped silicate glass dielectric layer having a dielectric constant greater than about 3.0 is particularly useful as an intrinsic planarizing stop layer within a damascene method. A bilayer dielectric layer construction comprising a carbon and halogen doped silicate glass and a carbon doped silicate glass dielectric layer absent halogen doping is useful within a dual damascene method.

18 Claims, 3 Drawing Sheets

| Film Quality | C & F Doped Film | C Only Doped Film |
|---|---|---|
| R1(248nm) | 1.5173 | 1.4638 |
| R1(633nm) | 1.4458 | 1.4049 |
| Density | 1.64 | 1.55 |
| Dry Etch Rate (Main/Over Etch) | 2654A/min | 2780A/min |
| Surface Charge | 1.18V | 1.6TV |
| Leakage Current (E=2MTfcm) | 4E-10A/cm2 | 5E-8A/CM2 |
| Hg-K value | 3.07-3.15 | 3.28-3.30 |
| Stress | 2.21 E+08 | 5.30E+08 |
| Stress Hystersis | 6.20 E+07 | 1.45E+08 |
| Hardness | 2.12GPa | 1.78 |
*Figure 10*
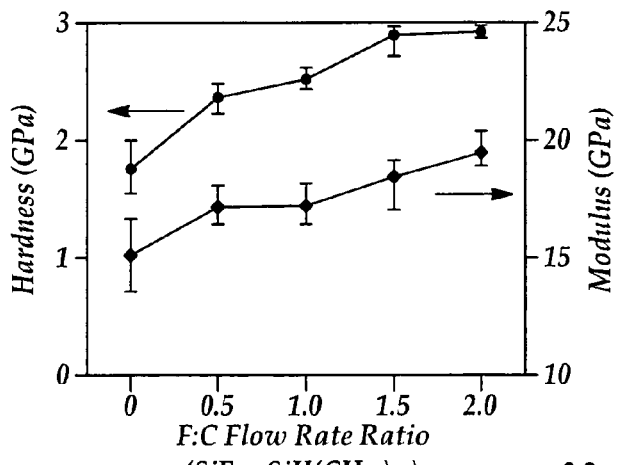
*Figure 11*
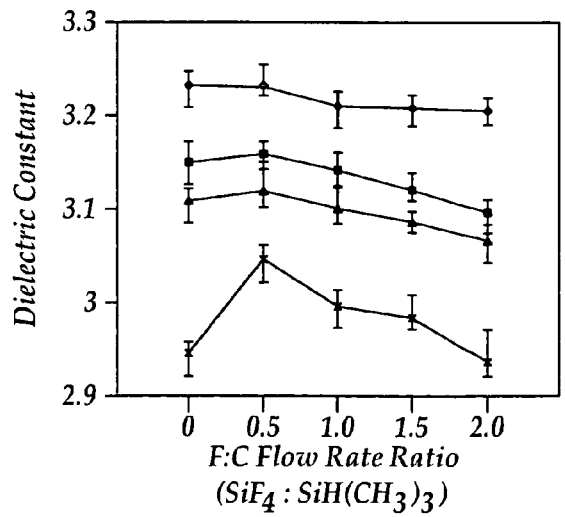
*Figure 12*

CARBON AND HALOGEN DOPED SILICATE GLASS DIELECTRIC LAYER AND METHOD FOR FABRICATING THE SAME

BACKGROUND OF THE INVENTION

1. Field of the Invention

The invention relates generally to dielectric layers employed within microelectronic products. More particularly, the invention relates to enhanced performance dielectric layers employed within microelectronic products.

2. Description of the Related Art

Microelectronic products are formed from substrates within which are formed microelectronic devices. The microelectronic devices are connected with patterned conductor layers that are separated by dielectric layers.

As microelectronic product integration levels have increased and microelectronic device and patterned conductor layer dimensions have decreased, it has become more common to employ comparatively lower dielectric constant dielectric materials interposed between the patterns of patterned conductor layers within microelectronic products. Comparatively lower dielectric constant dielectric materials are intended as dielectric materials having a dielectric constant of less than about 4, while more conventional silicon oxide, silicon nitride and silicon oxynitride dielectric materials have a dielectric constant of from greater than about 4 to about 8.

Also common in advanced microelectronic product fabrication is the use of damascene methods for forming patterned conductor layers that are separated by dielectric layers. Damascene methods are planarizing methods where a blanket conductor layer formed over a substrate and within an aperture defined by a patterned dielectric layer also formed over the substrate is planarized to form a patterned conductor layer within the aperture. Damascene methods are particularly desirable when forming patterned copper containing conductor layers within microelectronic products since copper materials are generally difficult to directly etch to form patterned copper containing conductor layers.

While comparatively low dielectric constant dielectric materials are desirable for forming patterned dielectric layers within microelectronic products and damascene methods are desirable for forming patterned conductor layers within apertures defined by the patterned dielectric layers, the use of damascene methods in conjunction with patterned dielectric layers formed of comparatively low dielectric constant dielectric materials is not entirely without problems. In that regard, patterned dielectric layers formed of comparatively low dielectric constant dielectric materials are generally insufficiently hard for use as planarizing stop layers within damascene methods.

It is thus desirable to provide comparatively low dielectric constant dielectric layers with enhanced physical properties, for use within damascene methods. The invention is directed towards that object.

SUMMARY OF THE INVENTION

A first object of the invention is to provide a comparatively low dielectric constant dielectric layer and a method for fabrication thereof.

A second object of the invention is to provide a comparatively low dielectric constant dielectric layer and method for fabrication thereof in accord with the first object of the invention, wherein the comparatively low dielectric constant dielectric layer is formed with enhanced physical properties.

In accord with the objects of the invention, the invention provides a comparatively low dielectric constant dielectric layer and a method for fabrication thereof.

The method first provides a substrate. The method also provides for forming over the substrate a carbon and halogen doped silicate glass dielectric layer while employing a chemical vapor deposition method employing a carbon source material separate from a halogen source material.

The invention also contemplates a microelectronic product comprising a substrate having formed thereover a carbon and halogen doped silicate glass dielectric layer formed with a specific dielectric constant range, which may be formed employing a specified deposition temperature range.

The invention provides a comparatively low dielectric constant dielectric layer with enhanced physical properties, and a method for fabrication thereof.

The invention realizes the foregoing object by employing when forming the comparatively low dielectric constant dielectric layer a carbon source material separate from a halogen source material to form the comparatively low dielectric constant dielectric layer of a carbon and halogen doped comparatively low dielectric constant dielectric material. The invention also preferably employs a specified deposition temperature for forming the comparatively low dielectric constant dielectric layer of a specified dielectric constant.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 10 shows a compilation of film properties for a carbon and fluorine doped silicate glass dielectric layer in accord with the invention in comparison with a carbon doped silicate glass dielectric layer absent fluorine doping.

FIG. 11 shows a graph of hardness and modulus as a function of fluorine to carbon dopant ratio for carbon and fluorine doped silicate glass dielectric layers in accord with the invention.

FIG. 12 shows a graph of dielectric constant versus fluorine to carbon dopant ratio for forming a series of carbon and fluorine doped silicate glass dielectric layers at various temperatures in accord with the invention.

DESCRIPTION OF THE PREFERRED EMBODIMENT

The invention provides a comparatively low dielectric constant dielectric layer with enhanced physical properties, and a method for fabrication thereof.

The invention realizes the foregoing object by employing when forming the comparatively low dielectric constant dielectric layer a carbon source material separate from a halogen source material to form the comparatively low dielectric constant dielectric layer of a carbon and halogen doped comparatively low dielectric constant dielectric material. The invention also preferably employs a specified deposition temperature for forming the comparatively low dielectric constant dielectric layer of a specified dielectric constant.

Figure 1:
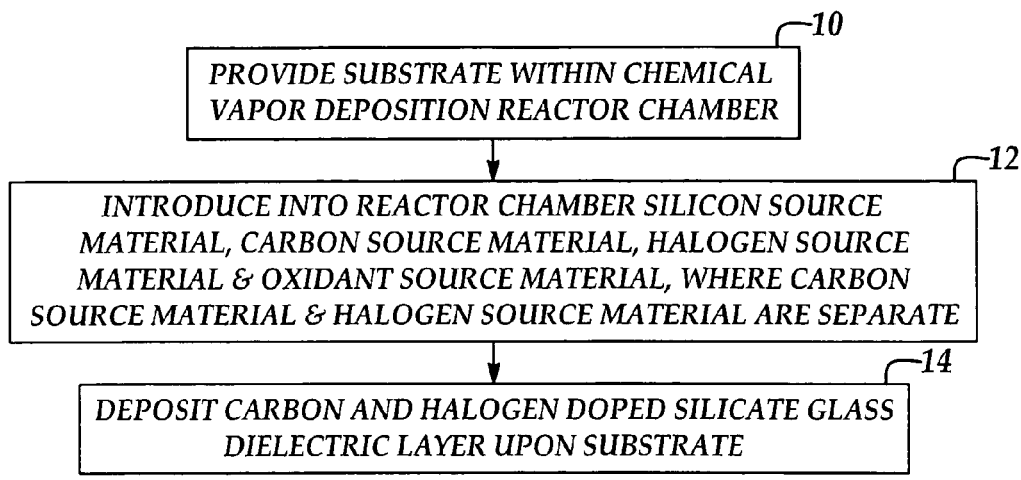
FIG. 1 shows a schematic process flow diagram illustrating the results of progressive steps in forming a carbon and halogen doped comparatively low dielectric constant dielectric layer in accord with the invention.

FIG. 1 shows a schematic process flow diagram illustrating the results of progressive process steps in forming a comparatively low dielectric constant dielectric layer in accord with a preferred embodiment of the invention.

In accord with reference numeral 10, the method first provides a substrate within a chemical vapor deposition reactor chamber.

Within the invention, the substrate may be employed within a microelectronic product selected from the group including but not limited to integrated circuit products, ceramic substrate products and optoelectronic products. The substrate may be formed of microelectronic materials including but not limited to conductor materials, semiconductor materials, dielectric materials and laminates thereof. Typically, the substrate comprises a semiconductor substrate.

The chemical vapor deposition reactor chamber may also be otherwise conventional, sized appropriately for the substrate and capable of a chemical vapor deposition reaction in accord with the invention.

In accord with reference numeral 12, the method provides for introducing into the chemical vapor deposition reactor chamber: (1) a silicon source material; (2) a carbon source material; (3) a halogen source material; and (4) an oxidant source material, where the carbon source material and the halogen source material are separate. The use of a carbon source material separate from a halogen source material provides at minimum for increased processing flexibility when forming a carbon and halogen doped silicate glass dielectric layer in accord with the invention.

Within the invention, the carbon source material may be (and preferably is) a silicon and carbon source material and the halogen source material may be (and preferably is) a silicon and halogen source material. Thus, the silicon source material may be intrinsic to at least one (and preferably both) of the carbon source material and the halogen source material. However, in accord with reference numeral 12, the carbon source material is separate from the halogen source material.

Appropriate silicon source materials when provided extrinsic to silicon and carbon source materials preferably include silane and disilane. Appropriate silicon and carbon source materials preferably include organosilanes such as but not limited to mono-, di-, tri- and tetra-organosilanes (i.e., $H_{(4-x)}SiR_x$ where x equals one to four, and where organosilanes are intended as having only carbon-silicon bonds and optionally carbon-hydrogen bonds and R is intended as a linear, branched or cyclic alkyl or aryl organic moiety of from about one to about 10 carbon atoms). Appropriate silicon and halogen source materials preferably include halogen substituted silanes such as mono-, di-, tri- and tetra-halosilanes (i.e., $H_{(4-x)}SiX_x$ where x equal one to four and X represents a halogen). A preferred halogen is fluorine, although other halogens such as bromine and iodine may also be employed.

Oxidant source materials may be conventional and may also include oxidants such as oxygen, ozone, nitrous oxide and nitric oxide, as is appropriate to the silicon source material, carbon source material, and halogen source material.

The invention preferably employs no extrinsic silicon source material, a trimethylsilane $((CH_3)_3SiH)$ or tetramethylsilane $(Si(CH_3)_4)$ silicon and carbon source material and a silicon tetrafluoride $(SiF_4)$ silicon and halogen source material, along with an oxygen oxidant source material.

In accord with reference numeral 14, the method finally provides for depositing a carbon and halogen (preferably fluorine) doped silicate glass dielectric layer upon the substrate within the chemical vapor deposition reactor chamber while employing the silicon source material, the separate carbon source material and halogen source material, and the oxidant source material.

To realize the foregoing result, the method also employs: (1) a chemical vapor deposition reactor chamber pressure of from about 2.5 to about 4 torr; (2) a source radio frequency power of from about 400 to about 800 watts; (3) a substrate temperature of from about 250 to about 400 degrees centigrade; (4) a trimethylsilane or tetramethylsilane flow rate of from about 400 to about 600 standard cubic centimeters per minute; (5) a silicon tetrafluoride flow rate of from about 100 to about 400 standard cubic centimeters per minute; and (6) an oxygen flow rate of from about 100 to about 300 standard cubic centimeters per minute. Within the context of the foregoing deposition parameters, a deposition rate of 5000 to about 6000 angstroms per hour may readily be achieved to provide the carbon and halogen doped silicate glass dielectric layer of thickness from about 2000 to about 20000 angstroms.

Also important to the present invention is that the carbon and halogen doped silicate glass dielectric layer, in particular when formed employing a deposition temperature of from about 250 to about 400 degrees centigrade, is formed over the substrate with a dielectric constant of greater than about 3.0 and preferably from about 3.1 to about 3.3. Under such circumstances, a carbon and halogen doped silicate glass dielectric layer in accord with the invention possesses enhanced physical properties (i.e., hardness and modulus) to directly or indirectly provide adequate planarizing stop properties within a damascene planarizing method.

FIG. 2 to FIG. 6 show a series of schematic cross-sectional diagrams illustrating the results of progressive stages in fabricating a microelectronic product having formed therein a carbon and halogen doped silicate glass dielectric layer in accord with the invention.

Figure 2:
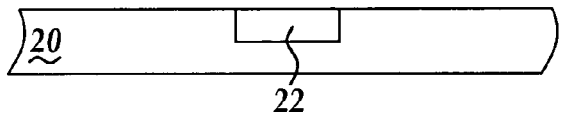
FIG. 2 to FIG. 6 show a series of schematic cross-sectional diagrams illustrating the results of progressive stages in forming a comparatively low dielectric constant dielectric layer within a microelectronic product in accord with a first embodiment of the invention.

FIG. 2 shows a substrate 20 having formed therein a contact region 22. The substrate 20 is intended as the substrate as referenced and described within FIG. 1. The contact region 22 is typically either a conductor contact region or a semiconductor contact region.

Figure 3:
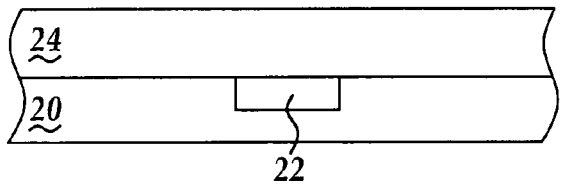

FIG. 3 shows a blanket carbon and halogen doped silicate glass dielectric layer 24 formed upon the substrate 20 including the contact region 22. The blanket carbon and halogen doped silicate glass dielectric layer 24 is formed in accord with the process steps and process limitations as outlined within FIG. 1.

Figure 4:
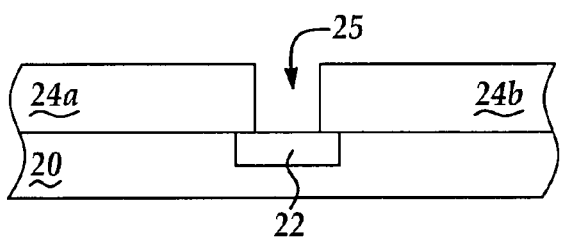

FIG. 4 shows the results of patterning the blanket carbon and halogen doped silicate glass dielectric layer 24 to form a pair of patterned carbon and halogen doped silicate glass dielectric layers 24a and 24b. The pair of patterned carbon and halogen doped silicate glass dielectric layers 24a and 24b defines an aperture 25. Such patterning may be effected employing etch methods as are conventional in the microelectronic product fabrication art. The etch methods will typically employ a pair of patterned photoresist layers and an anisotropic etching plasma that are not otherwise illustrated in FIG. 4. Typically, the etching plasma will employ a fluorine containing etchant gas composition.

Figure 5:
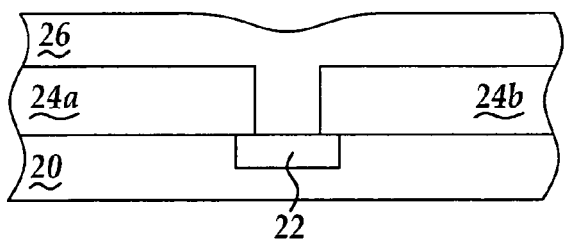

FIG. 5 shows the results of forming a blanket conductor layer 26 upon the pair of patterned carbon and halogen doped silicate glass dielectric layers 24a and 24b within the microelectronic product of FIG. 4. The blanket conductor layer 26 fills the aperture 25 defined by the pair of patterned carbon and halogen doped silicate glass dielectric layers 24a and 24b and contacts the contact region 22. The blanket conductor layer 26 typically comprises at least in part a copper containing conductor material, typically with a barrier material as an underlayer contacting the pair of patterned carbon and halogen doped silicate glass dielectric layers 24a and 24b and the contact region 22.

Figure 6:
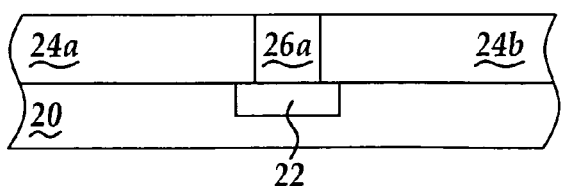

FIG. 6 shows the results of planarizing the blanket conductor layer 26 to form a patterned conductor layer 26a within the aperture 25 and contacting the contact region 22.

As noted above, since the carbon and halogen doped silicate glass dielectric layer 24 is formed with a generally higher deposition temperature in a range of from about 250 to about 400 degrees centigrade, the pair of patterned carbon and halogen doped silicate glass dielectric layers 24a and 24b serves effectively as planarizing stop layers when forming the patterned conductor layer 26a within the aperture 25. Thus, the invention does not require any additional extrinsic planarizing stop layers formed upon the pair of patterned carbon and halogen doped silicate glass dielectric layers 24a and 24b.

Figure 7:
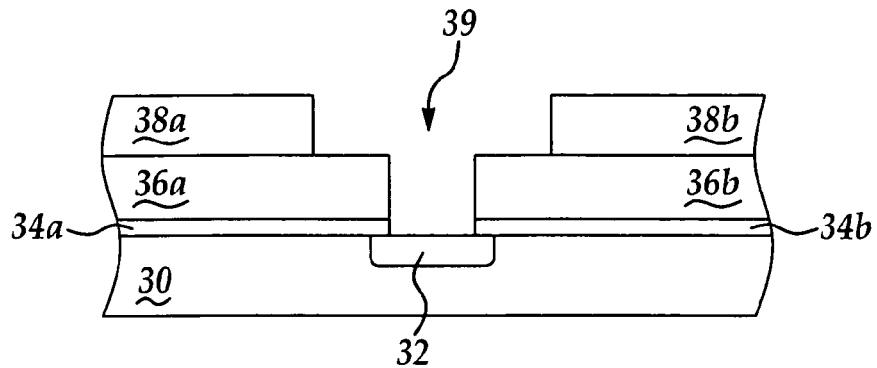
FIG. 7 to FIG. 9 show a series of schematic cross-sectional diagrams illustrating the results of progressive stages in forming a comparatively low dielectric constant dielectric layer within a microelectronic product in accord with a second embodiment of the invention.
Figure 8:
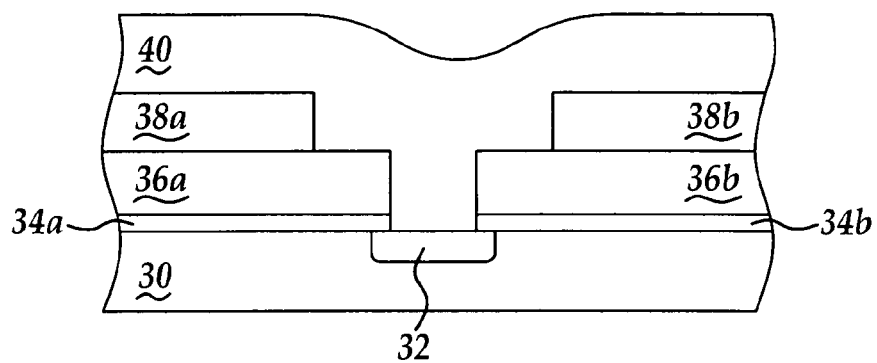
Figure 9:
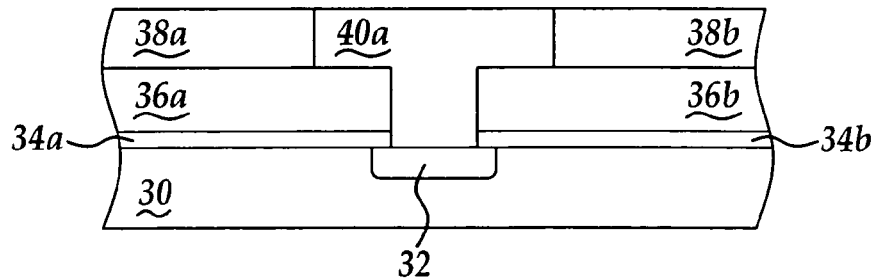

FIG. 7 to FIG. 9 show a series of schematic cross-sectional diagrams illustrating the results of forming a comparatively low dielectric constant dielectric material layer within a microelectronic product in accord with a second preferred embodiment of the invention.

The second preferred embodiment of the invention corresponds generally with the first preferred embodiment of the invention, but is directed towards a dual damascene structure and method rather than a single damascene structure and method.

FIG. 7 first shows a substrate 30 having formed therein a contact region 32. Within the second preferred embodiment of the invention, the substrate 30 and the contact region 32 correlate with the substrate 20 and the contact region 22 within the first preferred embodiment of the invention as illustrated within FIG. 2 to FIG. 6.

Shown also within FIG. 7, and formed upon the substrate 30 having formed therein the contact region 32, is a series of patterned layers comprising: (1) a pair of patterned barrier layers 34a and 34b formed upon the substrate 30 having formed therein the contact region 32; (2) a pair of patterned first dielectric layers 36a and 36b formed aligned upon the pair of patterned barrier layers 34a and 34b; and (3) a pair of patterned second dielectric layers 38a and 38b formed further recessed (i.e., further spaced) upon the pair of patterned first dielectric layers 36a and 36b. As is understood by a person skilled in the art, the series of patterned layers as illustrated in FIG. 7 forms a dual damascene aperture 39. Within the dual damascene aperture 39: (1) the pair of patterned barrier layers 34a and 34b and the pair of patterned first dielectric layers 36a and 36b form a via accessing the contact region 32; and (2) the pair of patterned second dielectric layers 38a and 38b defines a trench of areal dimensions greater than and overlapping the via.

The pair of barrier layers 34a and 34b may be formed of barrier materials selected from the group including but not limited to silicon nitride, carbon doped silicon nitride and carbon doped silicon oxide materials barrier materials. Typically, each of the pair of barrier layers 34a and 34b is formed to a thickness of from about 200 to about 500 angstroms.

Within the invention, one of the pair of patterned first dielectric layers 36a and 36b and the pair of patterned second dielectric layers 38a and 38b is formed of a carbon and halogen (preferably fluorine) doped silicate glass dielectric material, which is preferably, although not necessarily, formed in accord with the chemical vapor deposition method in accord with the invention. The other of the pair of patterned first dielectric layers 36a and 36b and the pair of patterned second dielectric layers 38a and 38b is formed of a carbon doped silicate glass dielectric material absent halogen (preferably fluorine) doping. Preferably, the carbon doped silicate glass dielectric material absent halogen doping is formed in-situ employing a single chemical vapor deposition reactor chamber and the same chemical vapor deposition method as employed for forming the carbon and halogen doped silicate glass dielectric material, but with the absence of a halogen source material. Each of the pair of patterned first dielectric layers 36a and 36b and the pair of patterned second dielectric layers 38a and 38b is preferably formed to a thickness of from about 2000 to about 10000 angstroms.

The second preferred embodiment of the invention provides value when either one of the pair of patterned first dielectric layers 36a and 36b and the pair of patterned second dielectric layers 38a and 38b is formed of the carbon and halogen doped silicate glass dielectric material. In particular, and in accord with the Examples that follow, the second preferred embodiment of the invention provides value even when the pair of patterned first dielectric layers 36a and 36b is formed of the carbon and halogen doped silicate glass dielectric material. Under such circumstances, enhanced properties of the pair of patterned first dielectric layers 36a and 36b formed of the carbon and halogen doped silicate glass dielectric material provide enhanced properties of the pair of patterned second dielectric layers 38a and 38b when formed of a carbon doped silicate glass dielectric material absent halogen doping.

FIG. 8 shows the results of forming a blanket conductor layer 40 upon the microelectronic product of FIG. 7 and filling the dual damascene aperture 39.

The blanket conductor layer 40 as illustrated within FIG. 8 is otherwise analogous, equivalent or identical to the blanket conductor layer 26 as illustrated in FIG. 5.

FIG. 9 shows the results of planarizing the blanket conductor layer 40 to form a patterned planarized conductor layer 40a (i.e., a contiguous conductor stud and conductor interconnect layer) within the dual damascene aperture 39.

The planarization as illustrated within the schematic cross-sectional diagram of FIG. 9 is otherwise analogous, equivalent or identical to the planarization as illustrated in FIG. 6.

FIG. 7 to FIG. 9 show a series of schematic cross-sectional diagrams illustrating the results of forming a microelectronic product in accord with the second preferred embodiment of the invention. The microelectronic product has formed therein a carbon and halogen doped silicate glass dielectric layer as well as a carbon doped silicate glass dielectric layer absent halogen doping. The former doped silicate glass dielectric layer provides enhanced performance of the microelectronic product.

EXAMPLES

FIG. 10 shows a compilation of measured values for parameters of a carbon and fluorine doped silicate glass dielectric layer in comparison with a carbon only (absent fluorine or other halogen) doped silicate glass dielectric layer. The carbon and fluorine doped silicate glass dielectric layer was formed employing conditions as generally outlined within the description accompanying FIG. 1. In particular, the carbon and fluorine doped silicate glass dielectric layer was formed employing a trimethylsilane silicon and carbon source material at a flow rate of about 500 standard cubic centimeters per minute and a silicon tetrafluoride silicon and fluorine source material at a flow rate of about 100 standard cubic centimeters per minute. The carbon only doped silicate glass dielectric layer was formed employing identical conditions but absent the silicon tetrafluoride silicon and fluorine source material.

As is illustrated within FIG. 10, the carbon and fluorine doped silicate glass dielectric layer in particular has a considerable increase in hardness that allows it to function as a chemical mechanical polish planarizing stop function within a damascene method.

FIG. 11 shows a graph of hardness or modulus versus fluorine source material to carbon source material flow rate ratio for forming a series of carbon and fluorine doped silicate glass dielectric layers in accord with the invention. Deposition conditions were generally in accord with the foregoing description of the preferred embodiment, in particular with a deposition temperature of about 250 degrees centigrade. As is illustrated in FIG. 11, both the hardness and the modulus of a carbon and fluorine doped silicate glass dielectric layer increase as a function of fluorine content within the carbon and fluorine doped silicate glass dielectric layer.

To further illustrate the value of the invention within the context of a dual damascene application in accord with the second preferred embodiment of the invention, two semiconductor substrates were prepared. A carbon and fluorine doped silicate glass dielectric layer was formed upon one of the semiconductor substrates in accord with the invention. The carbon and fluorine doped silicate glass dielectric layer was formed to a thickness of about 4000 angstroms. In turn, a carbon doped silicate glass dielectric layer absent fluorine doping was formed upon the carbon and fluorine doped silicate glass dielectric layer. The carbon doped silicate glass dielectric layer absent fluorine doping was also formed to a thickness of about 4000 angstroms. A carbon doped silicate glass dielectric layer of thickness about 8000 angstroms was formed as a single layer upon the second semiconductor substrate.

Hardness and modulus measurements were then obtained for each of the two comparatively low dielectric constant dielectric layers formed upon the two semiconductor substrates. Results of the measurements are reported in Table I as follows.

TABLE I

| Dielectric Layer | Hardness | Modulus |
|---|---|---|
| 8K SiOC only | 1.76 | 10.4 |
| 4K/4K SiOFC/SiOC | 2.02 | 12.6 |

As is illustrated within Table I, by merely employing as an underlayer a carbon and fluorine doped silicate glass dielectric layer, physical properties of an overlying carbon doped silicate glass dielectric layer absent fluorine doping are enhanced. The physical properties are enhanced such that the carbon doped silicate glass dielectric layer absent fluorine doping may be employed as a planarizing stop layer within a damascene or dual damascene method employing the bilayer dielectric layer laminated composition. Additionally, such bilayer doped silicate glass compositions may be deposited with enhanced uniformity and increased deposition tool utilization due to decreased maintenance needs. Since the carbon and fluorine doped silicate glass dielectric layer and the carbon doped silicate glass dielectric layer absent fluorine doping may have different etch properties with a plasma etch method, one may serve at least in part as an intrinsic etch stop with respect to the other when forming a trench within a dual damascene aperture.

To still further illustrate the value of the invention, an additional series of semiconductor substrates was prepared. A series of barrier layers was formed upon pairs of semiconductor substrates within the additional series of semiconductor substrates. The pairs of barrier layers were formed of silicon nitride, alpha carbon doped silicon nitride, beta carbon doped silicon nitride, carbon doped silicon oxide and tantalum nitride barrier materials. A carbon and fluorine doped silicate glass dielectric layer was formed upon one of each of a pair of semiconductor substrates having formed thereupon each of the foregoing barrier layers. A carbon doped silicate glass dielectric layer absent fluorine doping was formed upon the other of each of the pair of semiconductor substrates having formed thereupon each of the foregoing barrier layers. Either of the foregoing doped silicate glass dielectric layers was formed to a thickness of about 5000 angstroms. Each of the barrier layers was formed to a thickness of about 500 angstroms.

Doped silicate glass dielectric layer film adhesion to the barrier layers was determined for each of the foregoing series of pairs of barrier layer/dielectric layer combinations. Measurements were obtained employing methods as are conventional in the semiconductor product fabrication art. Results of the measurements are reported in Table II, in terms of enhanced adhesion for carbon and fluorine doped silicate glass dielectric layers to the various barrier layer compositions in comparison with adhesion of carbon doped silicate glass dielectric layers absent fluorine doping.

TABLE II

| Barrier Layer | Enhanced Adhesion (SiOFC vs SiOC) |
|---|---|
| SiN | 29 percent |
| a-SiCN | 69 |
| b-SiCN | 33 |
| SiOC | 64 |
| TaN | 11 |

As is seen from review of the data in Table II, a carbon and fluorine doped silicate glass dielectric layer in accord with the invention provides considerably enhanced adhesion to various barrier layer substrates in comparison with a carbon doped silicate glass dielectric layer absent fluorine doping. Thus, within a dual damascene structure that might employ a barrier layer, enhanced physical performance of a dielectric layer composition within a dual damascene structure is effected.

FIG. 12 shows a graph of dielectric constant versus fluorine source material to carbon source material flow rate ratio for forming a series of carbon and fluorine doped silicate glass dielectric layers at various temperatures in the 250 degree centigrade to 400 degree centigrade range. As is illustrated in FIG. 12, the dielectric constants of the series of carbon and fluorine doped silicate glass dielectric layers generally increase as a function of deposition temperature. Carbon and fluorine (or other halogen) doped silicate glass dielectric layers having a dielectric constant of greater than about 3.0 to about 3.3 and in particular in a range of from about 3.1 to about 3.3 and more particularly in a range of from about 3.1 to about 3.2 provide particularly effective planarizing stop layers within damascene methods or substrate layers within dual damascene methods.

The preferred embodiments of the invention are illustrative of the invention rather than limiting of the invention. Revisions and modifications may be made to methods, materials, structures and dimensions in accord with the preferred embodiments while still providing embodiments in accord with the invention, further in accord with the appended claims.

What is claimed is:

1. A method for fabricating a dielectric layer comprising:
   providing a substrate;
   forming over the substrate a carbon and halogen doped silicate glass dielectric layer while employing a chemical vapor deposition method employing a carbon source material separate from a halogen source material.

2. The method of claim 1 wherein the carbon source material is a silicon and carbon source material.

3. The method of claim 2 wherein the silicon and carbon source material is an organosilane.

4. The method of claim 1 wherein the halogen source material is a silicon and halogen source material.

5. The method of claim 4 wherein the silicon and halogen source material is a silicon halide.

6. The method of claim 1 wherein the chemical vapor deposition method employs a substrate temperature of greater than about 250 degrees centigrade.

7. The method of claim 1 wherein the chemical vapor deposition method employs a substrate temperature of from about 250 to about 400 degrees centigrade.

8. The method of claim 1 wherein the carbon and halogen doped silicate glass dielectric layer is formed to a thickness of from about 2000 to about 20000 angstroms.

9. The method of claim 1 further comprising forming contacting the carbon and halogen doped silicate glass dielectric layer a carbon doped silicate glass dielectric layer absent halogen doping.

10. A method for fabricating a dielectric layer comprising:
    providing a substrate;
    forming over the substrate a carbon and halogen doped silicate glass dielectric layer while employing a chemical vapor deposition method employing a deposition temperature at least about 250 degrees centigrade.

11. The method of claim 10 wherein the deposition temperature is from about 250 to about 400 degrees centigrade.

12. The method of claim 10 wherein the chemical vapor deposition method employs a carbon source material separate from a halogen source material.

13. The method of claim 12 wherein the carbon source material is a silicon and carbon source material.

14. The method of claim 13 wherein the silicon and carbon source material is an organosilane.

15. The method of claim 12 wherein the halogen source material is a silicon and halogen source material.

16. The method of claim 15 wherein the silicon and halogen source material is a silicon halide.

17. The method of claim 10 wherein the carbon and halogen doped silicate glass dielectric layer is formed to a thickness of from about 2000 to about 20000 angstroms.

18. The method of claim 10 further comprising forming contacting the carbon and halogen doped silicate glass dielectric layer a carbon doped silicate glass dielectric layer absent halogen doping.

* * * * *